(12) United States Patent
Luo et al.

(10) Patent No.: US 12,193,157 B2
(45) Date of Patent: Jan. 7, 2025

(54) DISPLAY SCREEN AND MANUFACTURING METHOD THEREOF (71) Applicant: WUHAN CHINA STAR OPTOELECTRONICS SEMICONDUCTOR DISPLAY TECHNOLOGY CO., LTD., Wuhan (CN)

(72) Inventors: Chengsheng Luo, Wuhan (CN); Tiyao Ma, Wuhan (CN); Yingchuan Jiang, Wuhan (CN); Wenxu Xianyu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/779,836

(22) PCT Filed: Apr. 24, 2022

(86) PCT No.: PCT/CN2022/088654
§ 371 (c)(1),
(2) Date: May 25, 2022

(87) PCT Pub. No.: WO2023/197364
PCT Pub. Date: Oct. 19, 2023

(65) Prior Publication Data
US 2024/0179842 A1 May 30, 2024

(30) Foreign Application Priority Data

Apr. 12, 2022 (CN) .......................... 202210378523.4

(51) Int. Cl.
*H05K 1/14* (2006.01)
*C09J 5/00* (2006.01)
(Continued)

(52) U.S. Cl.
CPC ................ *H05K 1/144* (2013.01); *C09J 5/00* (2013.01); *C09J 9/02* (2013.01); *H05K 3/368* (2013.01);
(Continued)

(58) Field of Classification Search
CPC .......... H05K 1/14; H05K 1/144; H05K 3/368; C09J 5/00; C09J 9/02; G09F 9/3026
(Continued)

(56) References Cited

U.S. PATENT DOCUMENTS

2007/0062639 A1 3/2007 Chang et al.
2017/0287984 A1 10/2017 Koresawa
(Continued)

FOREIGN PATENT DOCUMENTS

CN 103000491 A 3/2013
CN 103258751 A 8/2013
(Continued)

OTHER PUBLICATIONS

PCT International Search Report for International Application No. PCT/CN2022/088654, mailed on Dec. 15, 2022, 10pp.
(Continued)

*Primary Examiner* — Tremesha W Burns
(74) *Attorney, Agent, or Firm* — The Roy Gross Law Firm, LLC; Roy Gross (57) ABSTRACT

A display screen and a manufacturing method thereof are disclosed. A first conductive adhesive and a second conductive adhesive are disposed between a daughter board and a mother board. A first adhesive force is formed between the first conductive adhesive and the daughter board, a second
(Continued)

adhesive force is formed between the first conductive adhesive and the second conductive adhesive, and a third adhesive force is formed between the second conductive adhesive and the mother board. A technical problem of the daughter board and the mother board being difficult to separate for rework after assembly can be solved by allowing both the first adhesive force and the second adhesive force to be greater than the third adhesive force.

18 Claims, 4 Drawing Sheets

(51) Int. Cl.
    *C09J 9/02*       (2006.01)
    *H05K 3/36*       (2006.01)
    *G09F 9/302*     (2006.01)

(52) U.S. Cl.
    CPC ...... *G09F 9/3026* (2013.01); *H05K 2201/041* (2013.01); *H05K 2201/10128* (2013.01)

(58) Field of Classification Search
    USPC ........................................................ 361/784
    See application file for complete search history.

(56) References Cited

U.S. PATENT DOCUMENTS

| | | | |
|---|---|---|---|
| 2021/0217806 A1 | 7/2021 | Xi et al. | |
| 2024/0146303 A1* | 5/2024 | Shang | H05K 1/111 |

FOREIGN PATENT DOCUMENTS

| | | | |
|---|---|---|---|
| CN | 103400792 | A | 11/2013 |
| CN | 103870015 | A | 6/2014 |
| CN | 109742566 | A | 5/2019 |
| CN | 112114452 | A | 12/2020 |
| CN | 112420969 | A | 2/2021 |
| CN | 112750367 | A | 5/2021 |
| CN | 113112925 | A | 7/2021 |
| CN | 113488520 | A | 10/2021 |
| CN | 113851054 | A | 12/2021 |
| JP | 2002049018 | A | 2/2002 |
| TW | 201327920 | A | 7/2013 |
| WO | 2021259085 | A1 | 12/2021 |

OTHER PUBLICATIONS

PCT Written Opinion of the International Search Authority for International application No. PCT/CN2022/088654, mailed on Dec. 15, 2022, 7pp.

Chinese Office Action issued in corresponding Chinese Patent Application No. 202210378523.4 dated Nov. 22, 2022, pp. 1-10, 22pp.

* cited by examiner

DISPLAY SCREEN AND MANUFACTURING METHOD THEREOF

CROSS REFERENCE TO RELATED APPLICATIONS

This application is a National Phase of PCT Patent Application No. PCT/CN2022/088654 having International filing date of Apr. 24, 2022, which claims the benefit of priority of Chinese Patent Application No. 202210378523.4, filed Apr. 12, 2022, the contents of which are all incorporated herein by reference in their entirety.

FIELD OF INVENTION

The present disclosure relates to the field of display technologies, and more particularly, to a display screen and a manufacturing method thereof.

BACKGROUND OF INVENTION

In recent years, display technologies have developed rapidly, and as pixel sizes continue to decrease, application scenarios of displays have become wider. They have gradually developed from an original indoor and outdoor, large-scale, and long-distance advertising screens to indoor and outdoor, short-distance, and high-definition display screens. At present, large-screen displays mainly adopt splicing display technologies, that is, small-sized daughter boards are spliced into large screens having any size.

Figure 1:
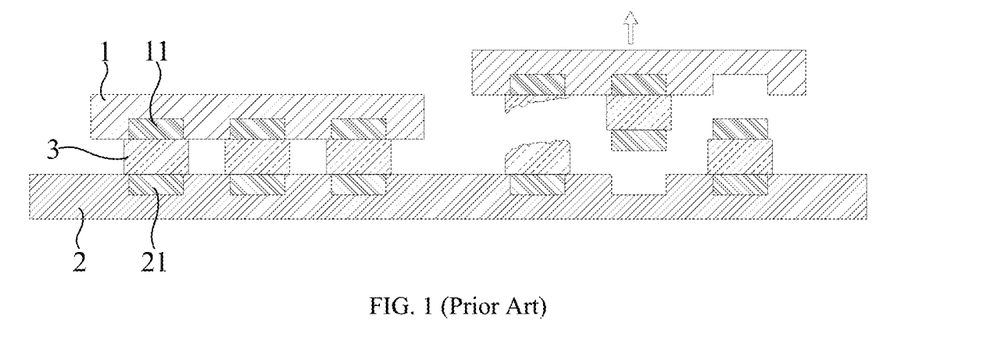
FIG. 1 is a schematic structural diagram of separating a mother board and daughter boards after assembly in current technology.

Referring to FIG. 1, FIG. 1 shows a new type of a display screen structure. Daughter boards 1 and a mother board 2 can be connected to each other by adhesives to allow one mother board 2 can be connected to multiple daughter boards 1 at a same time, thereby realizing to splicing the daughter boards 1. As shown in FIG. 1, regarding a daughter board 1 on the left, bonding pads 11 of the daughter board 1 are connected to bonding pads 21 of the mother board 2 by conductive adhesives 3, thereby allowing the daughter board 1 to be electrically connected to the mother board 2. After the conductive adhesives 3 are cured, if the daughter board 1 and the mother board 2 are abnormal, the daughter board 1 and the mother board 2 need to be separated for rework. However, it is difficult to separate the daughter board 1 from the mother board 2. As shown in a daughter board 1 on the right, following problems easily occur when the daughter board 1 is separated from the mother board 2:

(1) the conductive adhesives 3 have residue on a surface of the mother board 2, and it is difficult to clean the residue of the conductive adhesives 3, which causes a thickness of the conductive adhesives 3 to be difficult to control after subsequent rework, thereby resulting in thickness uniformity of the conductive adhesives 3 being low;

(2) the conductive adhesives 3 adhere the bonding pads 11 of the daughter board 1 to the mother board 2, causing the daughter board 1 to be damaged; and (3) the conductive adhesives 3 adhere the bonding pads 21 of the mother board 2 to the daughter board 1, causing the mother board 2 to be damaged.

Therefore, it is necessary to provide a technical solution to solve the problems above.

Technical problem: an embodiment of the present disclosure provides a display screen and a manufacturing method thereof, which can solve technical problems of the daughter boards and the mother board being difficult to separate from each other for rework after assembly.

SUMMARY OF INVENTION

An embodiment of the present disclosure provides a display screen, which includes:
a mother board;
at least one daughter board disposed opposite to the mother board;
a first conductive adhesive disposed between the mother board and the at least one daughter board, wherein, a first adhesive force is formed between the first conductive adhesive and the at least one daughter board; and
a second conductive adhesive disposed between the first conductive adhesive and the mother board, wherein, a second adhesive force is formed between the first conductive adhesive and the second conductive adhesive, and a third adhesive force is formed between the second conductive adhesive and the mother board;
wherein, both the first adhesive force and the second adhesive force are greater than the third adhesive force.

Optionally, in some embodiments of the present disclosure, a material of the first conductive adhesive includes a first matrix resin and a first conductor, a material of the second conductive adhesive includes a second matrix resin and a second conductor, and a content of the first matrix resin in the first conductive adhesive is greater than a content of the second matrix resin in the second conductive adhesive.

Optionally, in some embodiments of the present disclosure, the material of the first conductive adhesive includes 8 wt % to 22 wt % of the first matrix resin, and the material of the second conductive adhesive includes 3 wt % to 17 wt % of the second matrix resin.

Optionally, in some embodiments of the present disclosure, the first matrix resin includes a polar group, and the second matrix resin includes another polar group.

Optionally, in some embodiments of the present disclosure, a morphology of the first conductor is non-granular.

Optionally, in some embodiments of the present disclosure, the morphology of the first conductor is linear, branched, or scale-like.

Optionally, in some embodiments of the present disclosure, a morphology of the second conductor is granular.

Optionally, in some embodiments of the present disclosure, the at least one daughter board is provided with a first bonding pad, and the first conductive adhesive is connected to the first bonding pad;
the mother board is provided with a second bonding pad, and the second conductive adhesive is connected to the second bonding pad; and
the first bonding pad is electrically connected to the second bonding pad by the first conductive adhesive and the second conductive adhesive.

Optionally, in some embodiments of the present disclosure, the at least one daughter board is defined with a groove corresponding to the first bonding pad, the first bonding pad is disposed at a bottom of the groove, the first conductive adhesive covers the groove, and a surface of the first conductive adhesive away from the first bonding pad is beyond an opening of the groove.

Optionally, in some embodiments of the present disclosure, a part of the first conductive adhesive beyond the opening of the groove has a width greater than a width of the groove.

An embodiment of the present disclosure further provides a manufacturing method of a display screen. The method includes following steps:

a step B1: providing a mother board and at least one daughter board;

a step B2: disposing a first conductive adhesive on the at least one daughter board, wherein, a first adhesive force is formed between the first conductive adhesive and the at least one daughter board;

a step B3: disposing a second conductive adhesive on the first conductive adhesive, wherein, a second adhesive force is formed between the first conductive adhesive and the second conductive adhesive; and a step B4: assembling the mother board and the at least one daughter board, wherein, the first conductive adhesive and the second conductive adhesive are disposed between the mother board and the at least one daughter board, a third adhesive force is formed between the second conductive adhesive and the mother board, and both the first adhesive force and the second adhesive force are greater than the third adhesive force.

Optionally, in some embodiments of the present disclosure, the step B2 further includes following steps:

a step B21: disposing a first conductive paste on the at least one daughter board; and a step B22: curing the first conductive paste to obtain the first conductive adhesive.

Optionally, in some embodiments of the present disclosure, the step B3 includes a step of disposing a second conductive paste on the first conductive adhesive to form the second conductive adhesive; and a component of the first conductive paste includes a first matrix resin and a first conductor, a component of the second conductive paste includes a second matrix resin and a second conductor, and a content of the first matrix resin in the first conductive paste is greater than a content of the second matrix resin in the second conductive paste.

Optionally, in some embodiments of the present disclosure, the first conductive paste includes 10 wt % to 20 wt % of the first matrix resin, and the second conductive paste includes 5 wt % to 15 wt % of the second matrix resin.

Optionally, in some embodiments of the present disclosure, the first matrix resin includes a polar group, and the second matrix resin includes another polar group.

Optionally, in some embodiments of the present disclosure, a morphology of the first conductor is non-granular.

Optionally, in some embodiments of the present disclosure, the morphology of the first conductor is linear, branched, or scale-like.

Optionally, in some embodiments of the present disclosure, a morphology of the second conductor is granular.

Optionally, in some embodiments of the present disclosure, in the step B4, after assembling the mother board and the at least one daughter board, the second conductive adhesive is pre-cured.

Optionally, in some embodiments of the present disclosure, the manufacturing method of the display screen further includes following steps:

a step B5: conducting an electrical test on the first conductive adhesive and the second conductive adhesive, proceeding to a step B6 if conductive properties of the first conductive adhesive and the second conductive adhesive are qualified, and proceeding to a step B7 if the conductive properties of the first conductive adhesive and the second conductive adhesive are abnormal;

the step B6: post-curing the second conductive adhesive; and the step B7: separating the mother board from the at least one daughter board, cleaning the mother board and the at least one daughter board, and repeating the steps B3 to B5.

Beneficial effect: the display screen and the manufacturing method thereof are disclosed in the embodiments of the present disclosure. The first conductive adhesive and the second conductive adhesive are disposed between the at least one daughter board and the mother board. The first adhesive force is formed between the first conductive adhesive and the at least one daughter board, the second adhesive force is formed between the first conductive adhesive and the second conductive adhesive, and the third adhesive force is formed between the second conductive adhesive and the mother board. Both the first adhesive force and the second adhesive force are greater than the third adhesive force. When there is a need for rework, during a process of separating the at least one daughter board from the mother board, since the adhesion force between the second conductive adhesive and the mother board is small, the second conductive adhesive is not prone to remain on the mother board, thereby reducing the difficulty of cleaning the mother board and being beneficial to control thickness uniformity of the second conductive adhesive in subsequent rework. In addition, since the second conductive adhesive is easily detached from the mother board, film layers of the mother board or the at least one daughter board will not be damaged.

DESCRIPTION OF DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refers to the outline of the device.

The embodiments of the present disclosure provide a display screen and a manufacturing method thereof. They will be described in detail in the following. It should be noted that an order of description in the following embodiments is not meant to limit a preferred order of the embodiments.

Figure 2:
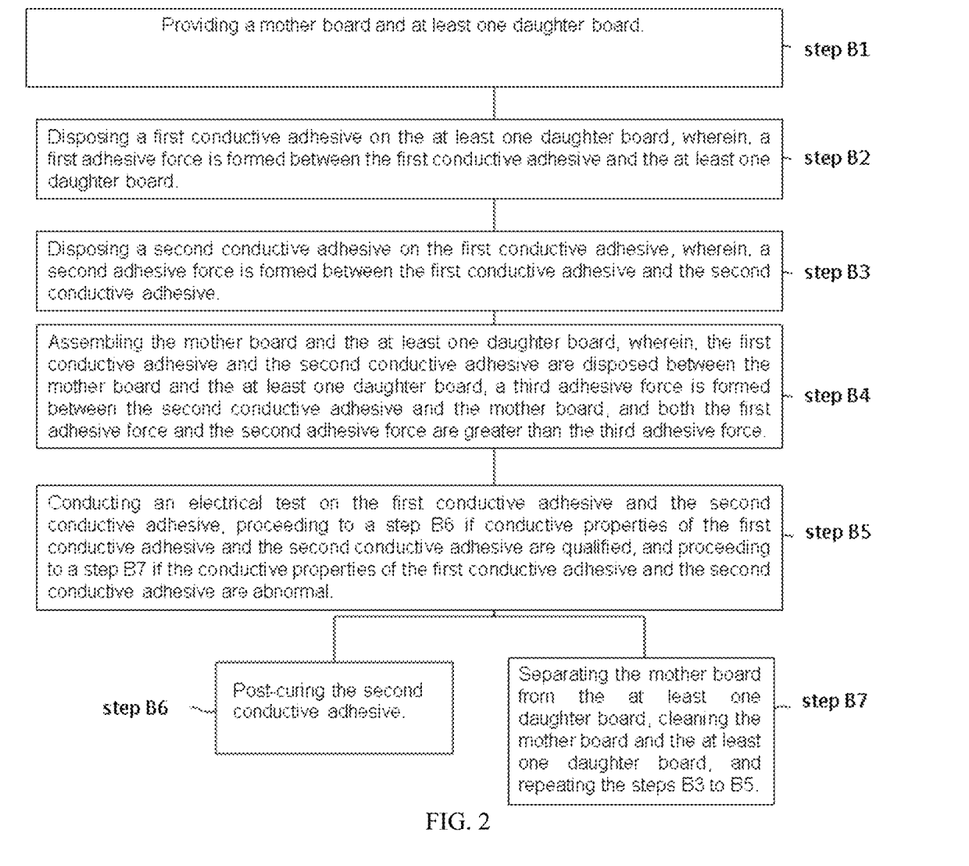
FIG. 2 is a flowchart of a manufacturing method of a display screen according to an embodiment of the present disclosure.

Referring to FIG. 2, this embodiment of the present disclosure provides the manufacturing method of the display screen. By assembling a plurality of daughter boards 100 on one mother board 200, the plurality of daughter boards 100 can be spliced together, thereby realizing large-screen display. In this embodiment, the daughter boards 100 may be display devices, and specifically may be liquid crystal display panels, light-emitting diode display panels, organic light-emitting diode display panels, or other display devices, which are not specifically limited herein.

Figure 3:
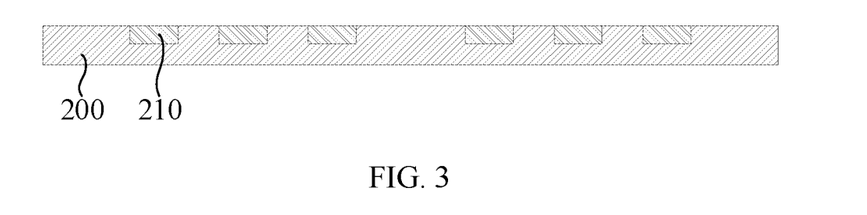
FIG. 3 is a schematic structural diagram of a mother board according to an embodiment of the present disclosure.
Figure 4:
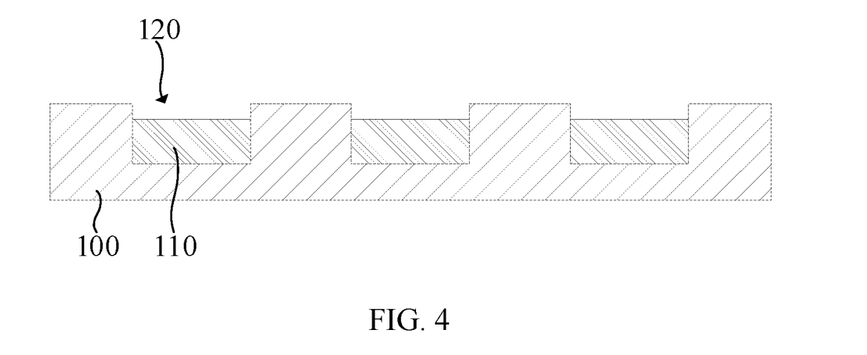
FIG. 4 is a schematic structural diagram of a daughter board according to an embodiment of the present disclosure.
Figure 5:
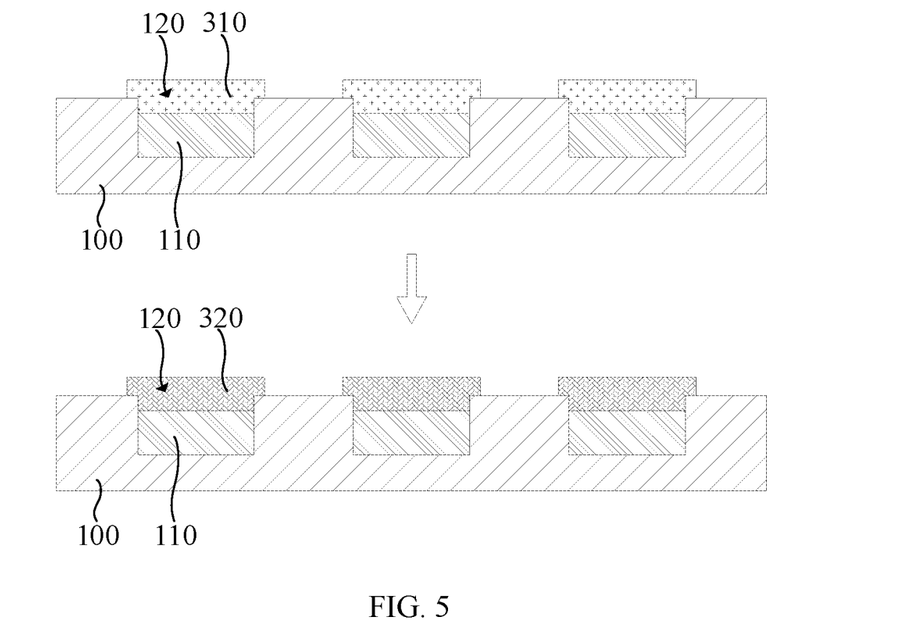
FIG. 5 is a schematic structural diagram of forming a first conductive adhesive on the daughter board according to an embodiment of the present disclosure.
Figure 6:
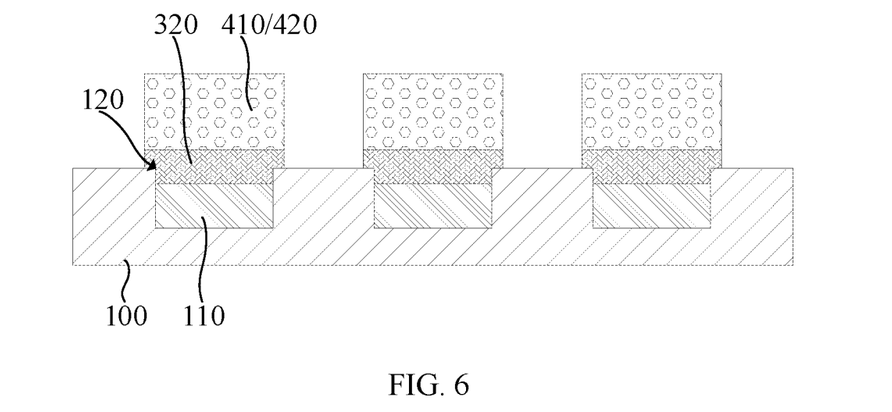
FIG. 6 is a schematic structural diagram of forming a second conductive adhesive on the first conductive adhesive according to an embodiment of the present disclosure.
Figure 7:
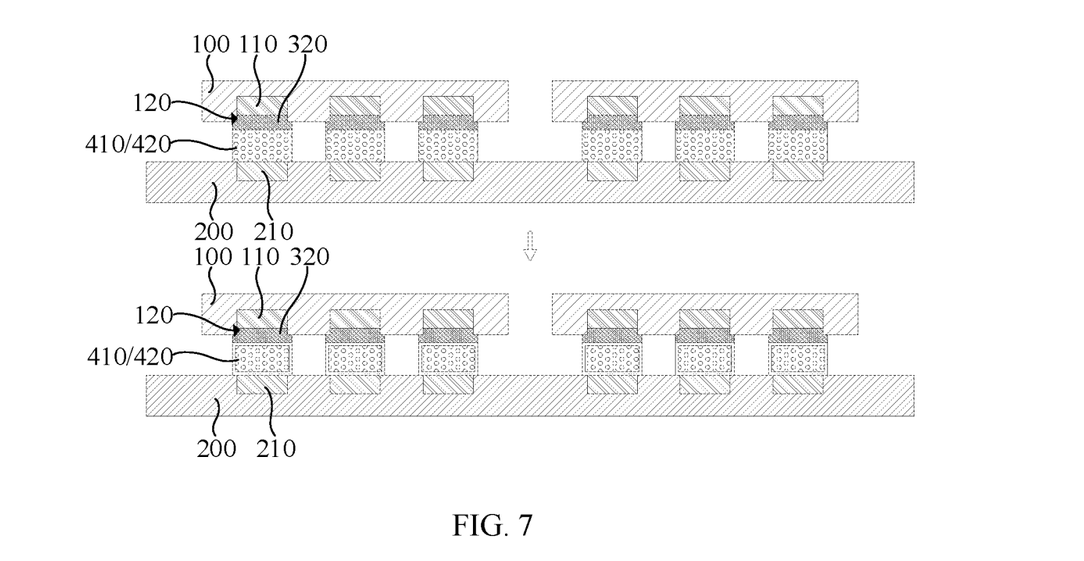
FIG. 7 is a schematic structural diagram of assembling the mother board and daughter boards and pre-curing the second conductive adhesive according to an embodiment of the present disclosure.

Specifically, the manufacturing method of the display screen includes following steps:

a step B1: as shown in FIGS. 3 and 4, providing a mother board 200 and at least one daughter board 100;

a step B2: as shown in FIG. 5, disposing a first conductive adhesive 320 on the at least one daughter board 100, wherein, a first adhesive force is formed between the first conductive adhesive 320 and the at least one daughter board 100;

a step B3: as shown in FIG. 6, disposing a second conductive adhesive 420 on the first conductive adhesive 320, wherein, a second adhesive force is formed between the first conductive adhesive 320 and the second conductive adhesive 420; and a step B4: as shown in FIG. 7, assembling the mother board 200 and the at least one daughter board 100, wherein, the first conductive adhesive 320 and the second conductive adhesive 420 are disposed between the mother board 200 and the at least one daughter board 100, a third adhesive force is formed between the second conductive adhesive 420 and the mother board 200, and both the first adhesive force and the second adhesive force are greater than the third adhesive force.

Figure 8:
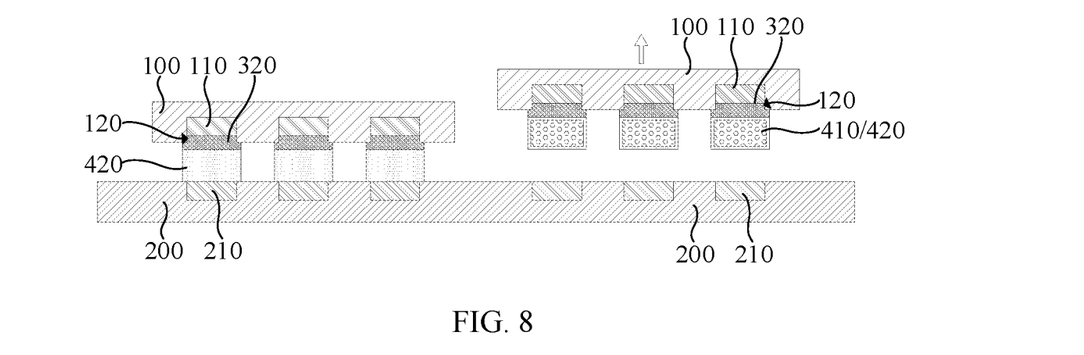
FIG. 8 is a schematic structural diagram of post-curing the second conductive adhesive on one daughter board and separating another daughter board from the mother board according to an embodiment of the present disclosure.

In the manufacturing method of the display screen of the embodiment of the present disclosure, the first conductive adhesive 320 and the second conductive adhesive 420 are disposed between the at least one daughter board 100 and the mother board 200. The first adhesive force is formed between the first conductive adhesive 320 and the at least one daughter board 100, the second adhesive force is formed between the first conductive adhesive 320 and the second conductive adhesive 420, and the third adhesive force is formed between the second conductive adhesive 420 and the mother board 200. Both the first adhesive force and the second adhesive force are greater than the third adhesive force. As shown in FIG. 8, when there is a need for rework, during a process of separating the at least one daughter board 100 from the mother board 200, since the adhesion force between the second conductive adhesive 420 and the mother board 200 is small, the second conductive adhesive 420 is not prone to remain on the mother board 200, thereby reducing the difficulty of cleaning the mother board 200 and being beneficial to control thickness uniformity of the second conductive adhesive 420 in subsequent rework. In addition, since the second conductive adhesive 420 is easily detached from the mother board 200, film layers of the mother board 200 or the at least one daughter board 100 will not be damaged.

Specifically, as shown in FIGS. 3 and 4, in the step B1 mentioned above, the at least one daughter board 100 is provided with a first bonding pad 110, and the mother board 200 is provided with a second bonding pad 210 corresponding to the first bonding pads 110. In the embodiments of the present disclosure, by electrically connecting the first bonding pad 110 to the second bonding pad 210, one mother board 200 can drive and control at least two daughter boards 100 at a same time. Specifically, the mother board 200 is provided with a driving circuit, the driving circuit includes the second bonding pad 210, and the driving circuit drives the daughter boards 100 to display pictures by the second bonding pad 210 and the first bonding pad 110.

Specifically, in the embodiments of the present disclosure, one of the daughter boards 100 can be provided with a plurality of first bonding pads 110, the mother board 200 can be provided with a plurality of second bonding pads 210, and the first bonding pads 110 correspond to the second bonding pads 210 by one-to-one. A number of the first bonding pads 110 and second bonding pads 210 may be adjusted according to actual situations and specific requirements, and is not specifically limited herein.

Specifically, as shown in FIG. 5, in the step B2, the first conductive adhesive 320 is formed on the first bonding pads 110. As shown in FIG. 6, in the step B3, the second conductive adhesive 420 is formed on the first conductive adhesives 320, and the second conductive adhesive 420 is also disposed corresponding to the first bonding pads 110. As shown in FIG. 7, in the step B4, the first bonding pads 110 are disposed opposite to the second bonding pads 210, and the second conductive adhesive 420 abuts on the second bonding pads 210. By the above settings, the mother board 200 can be electrically connected to the at least one daughter board 100, and one mother board 200 can control at least two daughter boards 100 to display images at the same time.

Specifically, the step B2 includes following steps:

a step B21: disposing a first conductive paste 310 on the at least one daughter board 100, wherein, specifically, the first conductive paste 310 may be disposed by but is not limited to dispensing process or nanoimprint lithography, and the first conductive paste 310 at least covers a surface of the first bonding pads 110; and a step B22: curing the first conductive paste 310 to obtain the first conductive adhesive 320. In the embodiments of the present disclosure, the first conductive adhesive 320 can be stably fixed onto the surface of the first bonding pads 110 by curing the first conductive paste 310, thereby greatly improving the first adhesive force between the first conductive adhesive 320 and the at least one daughter board 100.

Specifically, as shown in FIGS. 4 and 5, the at least one daughter board 100 is provided with grooves 120 corresponding to the first bonding pads 110, and the grooves 120 correspond to the first bonding pads 110 by one-to-one. The grooves 120 expose the surface of the first bonding pads 110, thereby being facilitating the first conductive paste 310 to be disposed on the surface of the first bonding pads 110. In this embodiment, the first bonding pads 110 are disposed at a bottom of the grooves 120, the surface of the first bonding pads 110 do not protrude from an opening of the grooves 120, and a surface of the first conductive adhesive 320 away from the first bonding pads 110 is beyond the opening of the grooves 120. In the step B21, the first conductive paste 310 is filled in the grooves 120 of the at least one daughter board 100, so that the first conductive adhesive 320 formed in the subsequent step B22 can cover the grooves 120. By the above settings, the first conductive adhesive 320 can be adhered onto the surface of the first bonding pads 110 and can also adhered onto side walls of the grooves 120, which can increase a contact area between the first conductive adhesive 320 and the at least one daughter board 100, thereby greatly improving the first adhesive force between the first conductive adhesive 320 and the at least one daughter board 100.

In the embodiments of the present disclosure, a metal layer is disposed on one side of a substrate, the metal layer includes the first bonding pads 110, and then the grooves 120 are defined on another side of the substrate. The grooves 120 can be obtained by but is not limited to laser drilling. A hole depth of the grooves 120 is exactly exposing the surface of the first bonding pads 110, and the at least one daughter board 100 is obtained.

Specifically, as shown in FIG. 5, in the step B21, a thickness of the first conductive paste 310 is greater than a depth of the grooves 120, that is, a surface of the first conductive paste 310 away from the first bonding pads 110 exceeds a plane where the opening of the grooves 120 is located. The surface of the subsequently formed first conductive adhesive 320 away from the first bonding pads 110 also exceeds the plane where the opening of the grooves 120 is located. It should be understood that the depth of the grooves 120 refers to a distance from the exposed surface of the first bonding pads 110 to the opening of the grooves 120. By the above settings, a thickness of the subsequently formed first conductive adhesive 320 is greater than the depth of the grooves 120, that is, the first conductive adhesive 320 exceeds the opening of the grooves 120, thereby ensuring the grooves 120 to be fully filled with the first conductive adhesive 320. Since the thickness of the first conductive paste 310 is greater than the depth of the grooves 120 and the first conductive paste 310 has certain fluid properties, the part of the first conductive paste 310 beyond the opening of the grooves 120 will overflow from the opening of the grooves 120. That is, a cross-sectional area of the part of the first conductive paste 310 beyond the opening of the grooves 120 is larger than that of the opening of the grooves 120, and a cross-sectional area of a part of the first conductive adhesive 320 formed subsequently that exceeds the opening of the grooves 120 is also larger than that of the opening of the grooves 120. Therefore, a contact area between the first conductive adhesive 320 and the second conductive adhesive 420 can be increased, thereby greatly improving the second adhesive force between the first conductive adhesive 320 and the second conductive adhesive 420. In this embodiment, a width of the part of the first conductive paste 310 that exceeds the opening of the grooves 120 is greater than a width of the grooves 120, and a width of the part of the first conductive adhesive 320 obtained subsequently that exceeds the opening of the grooves 120 is also greater than the width of the grooves 120.

Specifically, the depth of the grooves 120 may range from 5 μm to 10 μm. For example, the depth of the grooves 120 may be 5 μm, 6 μm, 7 μm, 8 μm, 9 μm, or 10 μm. Of course, the depth of the grooves 120 may be adjusted according to actual situations and specific requirements, and is not specifically limited herein.

Specifically, the thickness of the first conductive paste 310 may range from 6 μm to 20 μm. For example, the thickness of the first conductive paste 310 may be 6 μm, 7 μm, 8 μm, 9 μm, 10 μm, 11 μm, 12 μm, 13 μm, 14 μm, 15 μm, 16 μm, 17 μm, 18 μm, 19 μm, or 20 μm. Of course, the thickness of the first conductive paste 310 may be adjusted according to actual situations and specific requirements, and is not specifically limited herein.

Specifically, the thickness of the first conductive adhesive 320 may range from 6 μm to 20 μm. For example, the thickness of the first conductive adhesive 320 may be 6 μm, 7 μm, 8 μm, 9 μm, 10 μm, 11 μm, 12 μm, 13 μm, 14 μm, 15 μm, 16 μm, 17 μm, 18 μm, 19 μm, or 20 μm. Of course, the thickness of the first conductive adhesive 320 may be adjusted according to actual situations and specific requirements, and is not specifically limited herein.

Specifically, as shown in FIG. 6, the step B3 specifically includes: disposing a second conductive paste 410 on the first conductive adhesive 320, and specifically, the second conductive paste 410 may be disposed by, but is not limited to, inkjet printing, stencil printing, screen printing, or dispensing process, thereby forming the second conductive adhesive 420. Wherein, a component of the first conductive paste 310 includes a first matrix resin, a first conductor, and a first additive, a component of the second conductive paste 410 includes a second matrix resin, a second conductor, and a second additive, and a content of the first matrix resin in the first conductive paste 310 is greater than a content of the second matrix resin in the second conductive paste 410. In the embodiments of the present disclosure, by allowing the content of the first matrix resin in the first conductive paste 310 to be greater than the content of the second matrix resin in the second conductive paste 410, the adhesion force between the first conductive adhesive 320 formed subsequently and the at least one daughter board 100 and the adhesion force between the first conductive adhesive 320 and the second conductive adhesive 420 are both greater than the adhesion between the second conductive adhesive 420 and the mother board 200, thereby allowing the first adhesive force and the second adhesive force are both greater than the third adhesive force.

Specifically, the thickness of the second conductive paste 410 may range from 20 μm to 200 μm. For example, the thickness of the second conductive paste 410 may be 20 μm, 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm, or 200 μm. Of course, the thickness of the second conductive paste 410 may be adjusted according to actual situations and specific requirements, and is not specifically limited herein.

Specifically, in the manufactured display screen, the thickness of the second conductive adhesive 420 may range from 20 μm to 200 μm. For example, the thickness of the second conductive adhesive 420 may be 20 µm, 30 µm, 40 µm, 50 µm, 60 µm, 70 µm, 80 µm, 90 µm, 100 µm, 110 µm, 120 µm, 130 µm, 140 µm, 150 µm, 160 µm, 170 µm, 180 µm, 190 µm, or 200 µm. Of course, the thickness of the second conductive adhesive 420 may be adjusted according to actual situations and specific requirements, and is not specifically limited herein.

Specifically, the first conductive paste 310 includes 10 wt % to 20 wt % of the first matrix resin, 50 wt % to 80 wt % of the first conductor, and 1 wt % to 5 wt % of the first additive, and the second conductive paste 410 includes 5 wt % to 15 wt % of the second matrix resin, 60 wt % to 85 wt % of the second conductor, and 0.1 wt % to 3 wt % of the second additive. It can be understood that the mass percentage of each component in the first conductive paste 310 and the second conductive paste 410 can be appropriately adjusted according to actual situations and specific requirements, and is not specifically limited herein.

Specifically, in the embodiments of the present disclosure, the first matrix resin and the second matrix resin may be photo-curable resins or thermosetting resins, which may be appropriately selected according to actual situations, and are not specifically limited herein.

Specifically, the first matrix resin may be selected from one or more of epoxy resins, phenolic resins, polyurethane resins, acrylic resins, and silicone resins. Similarly, the second matrix resin may be selected from one or more of epoxy resins, phenolic resins, polyurethane resins, acrylic resins, and silicone resins. Materials of the first matrix resin and the second matrix resin may be the same or different, and the materials of the first matrix resin and the second matrix resin may be appropriately adjusted according to actual situations and specific requirements, which are not specifically limited herein.

In the embodiments of the present disclosure, the first matrix resin and the second matrix resin are selected from epoxy resins, and the epoxy resins have high adhesion and wettability, and also have advantages of excellent mechanical and thermal properties, low shrinkage, and good bonding abilities, thereby allowing the first conductive adhesive 320 and the second conductive adhesive 420 manufactured subsequently to have good adhesion properties.

Specifically, the first matrix resin includes a polar group, and the second matrix resin includes another polar group. The interaction between the polar group of the first matrix resin and the polar group of the second matrix resin allows an extremely strong adhesion to form between the first conductive adhesive 320 and the second conductive adhesive 420, thereby greatly improving the second adhesive force. In this embodiment, the second adhesive force is much larger than the third adhesive force, so in the process of separating the at least one daughter board 100 from the mother board 200, the second conductive adhesive 420 will not remain on the mother board 200, which can reduce the difficulty of cleaning the mother board 200 in the rework process, thereby greatly reducing a risk of damaging film layers of the mother board 200 (such as the second bonding pads 210).

Specifically, the polar groups of the first matrix resin and the second matrix resin may be selected from a hydroxyl group, a carboxyl group, etc. The polar groups may be appropriately changed according to actual situations and specific requirements, and are not specifically limited herein.

Specifically, materials of the first conductor and the second conductor may be selected from conductive materials. Specifically, the materials of the first conductor and the second conductor may be selected from one or more of gold, silver, copper, molybdenum, and aluminum. The materials of the first conductor and the second conductor may be appropriately changed according to actual situations and specific requirements, and are not specifically limited herein.

Figure 9:
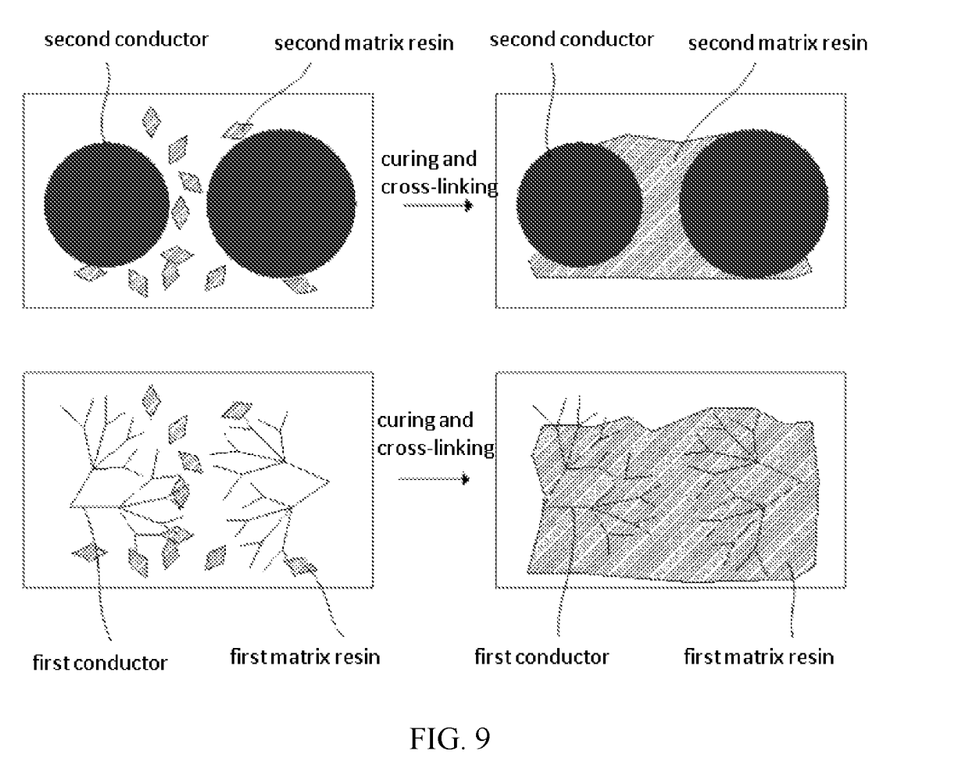
FIG. 9 is a schematic diagram of a principle of curing a conductive paste to form a conductive adhesive.

Specifically, as shown in FIG. 9, a morphology of the first conductor is non-granular, and more specifically, the morphology of the first conductor is linear, branched, or scale-like. When the first conductive paste 310 is curing, the fluidity of the first matrix resin in the molten state is better, and the first matrix resin and the first conductor can be fully in contact with each other, which is beneficial to improve a contact area between the first conductor and the first matrix resin, thereby improving the adhesion force of the first conductive adhesive 320, to obtain a dense film structure. This setting can enhance the second adhesive force. In this embodiment, the first conductor may be silver nanowires.

Specifically, as shown in FIG. 9, a morphology of the second conductor is granular. Compared to the first conductor, the morphology of the second conductor is granular, which is smoother. When the second conductive paste 410 is curing, the second matrix resin are mainly on upper and lower sides of the second conductor, and the connectivity in the middle is weak, so the fluidity of the second matrix resin in the molten state is weak, thereby reducing the adhesion force of the second conductive adhesive 420. This setting can reduce the third adhesive force. In this embodiment, the second conductor may be silver nanoparticles.

Specifically, in the second conductive paste 410 (or the second conductive adhesive 420), if a particle size of the second conductor gets larger, the adhesion force of the second conductive paste 410 (or the second conductive adhesive 420) will be smaller. If the particle size of the second conductor is too large, the adhesion force of the second conductive paste 410 (or the second conductive adhesive 420) will be overly small, and in the manufactured display screen, the first bonding pads 110 and the second bonding pads 210 are prone to have poor contact. If the particle size of the second conductor is too small, the adhesion force of the second conductive paste 410 (or the second conductive adhesive 420) will be overly large, thereby causing the at least one daughter board 100 to be difficult to peel off from the mother board 200 in the rework process.

In order to prevent the above problems, the particle size of the second conductor should be controlled to range from 10 nm to 200 nm. Therefore, the second conductive paste 410 (or the second conductive adhesive 420) can be ensured to have enough adhesion force to adhere onto the second bonding pads 210, and it can also ensure that the second conductive adhesive 420 can be peeled off from the mother board 200 in the rework process to reduce the residue.

Specifically, as shown in FIG. 7, in the step B4, after assembling the mother board 200 and the at least one daughter board 100, the second conductive adhesive 420 is pre-cured. Specifically, the second conductive adhesive 420 may be irradiated with UV light for 5 seconds to 10 seconds to allow the second conductive adhesive 420 to be in a surface-dry state. At this time, the adhesion between the second conductive adhesive 420 and the mother board 200 is weak. If the subsequent rework is required, the at least one daughter board 100 and the second conductive adhesive 420 thereon can be completely peeled off from the mother board 200 to reduce residual adhesives on the mother board 200.

Specifically, the manufacturing method of the display screen further includes following steps:

a step B5: conducting an electrical test on the first conductive adhesive 320 and the second conductive adhesive 420, proceeding to a step B6 if conductive properties of the first conductive adhesive 320 and the second conductive adhesive 420 are qualified, and proceeding to a step B7 if the conductive properties of the first conductive adhesive 320 and the second conductive adhesive 420 are abnormal;

the step B6: as shown in FIG. 8, post-curing the second conductive adhesive 420; and the step B7: as shown in FIG. 8, separating the mother board 200 from the at least one daughter board 100, cleaning the mother board 200 and the at least one daughter board 100, and repeating the steps B3 to B5.

Specifically, in the step B5, the step of conducting the electrical test on the first conductive adhesive 320 and the second conductive adhesive 420 may include testing whether on-resistances of the first conductive adhesive 320 and the second conductive adhesive 420 meet the requirements. For example, testing whether the on-resistances of the first conductive adhesive 320 and the second conductive adhesive 420 range from 100 ohms to 200 ohms, if the on-resistances of the first conductive adhesive 320 and the second conductive adhesive 420 are within the range of 100 ohms to 200 ohms, then proceed the step B6; and if the on-resistances of the first conductive adhesive 320 and the second conductive adhesive 420 are beyond the range of 100 ohms to 200 ohms, then proceed the step B7.

Specifically, in the step B7, the step of cleaning the mother board 200 and the at least one daughter board 100 may include using a solvent to remove the second conductive adhesive 420 remained on the mother board 200 for subsequent rework, and the solvent may be selected from one or more of dichloromethane, carbon tetrachloride, or acetone.

Figure 10:
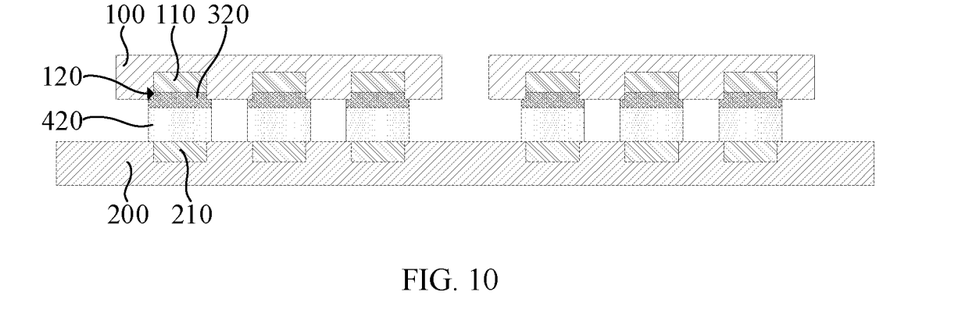
FIG. 10 is a schematic structural diagram of a display screen according to an embodiment of the present disclosure.

Referring to FIG. 10, an embodiment of the present disclosure further provides the display screen manufactured by the above method. The display screen includes the mother board 200, the at least one daughter board 100, the first conductive adhesive 320, and the second conductive adhesive 420. The at least one daughter board 100 is disposed opposite to the mother board 200. The first conductive adhesive 320 is disposed between the mother board 200 and the at least one daughter board 100, and the first adhesive force is formed between the first conductive adhesive 320 and the at least one daughter board 100. The second conductive adhesive 420 is disposed between the first conductive adhesive 320 and the mother board 200, the second adhesive force is formed between the first conductive adhesive 320 and the second conductive adhesive 420, and the third adhesive force is formed between the second conductive adhesive 420 and the mother board 200. Wherein, both the first adhesive force and the second adhesive force are greater than the third adhesive force.

Specifically, the at least one daughter board 100 is provided with a first bonding pad 110, and the mother board 200 is provided with a second bonding pad 210 corresponding to the first bonding pads 110. In the embodiments of the present disclosure, by electrically connecting the first bonding pad 110 to the second bonding pad 210, one mother board 200 can drive and control at least two daughter boards 100 at a same time. Specifically, the mother board 200 is provided with a driving circuit, the driving circuit includes the second bonding pad 210, and the driving circuit drives the daughter boards 100 to display pictures by the second bonding pad 210 and the first bonding pad 110. In this embodiment, the first conductive adhesive 320 is disposed corresponding to the first bonding pad 110, and the first conductive adhesive is connected to the corresponding first bonding pad 110. The second conductive adhesive 420 is disposed corresponding to the second bonding pad 210, and the second conductive adhesive 420 is connected to the corresponding second bonding pad 210. The first bonding pad 110 is electrically connected to the second bonding pad 210 by corresponding first conductive adhesive 320 and second conductive adhesive 420.

Specifically, in the embodiments of the present disclosure, one of the daughter boards 100 can be provided with a plurality of first bonding pads 110, the mother board 200 can be provided with a plurality of second bonding pads 210, and the first bonding pads 110 correspond to the second bonding pads 210 by one-to-one. A number of the first bonding pads 110 and second bonding pads 210 may be adjusted according to actual situations and specific requirements, and is not specifically limited herein.

Specifically, the at least one daughter board 100 is provided with grooves 120, and the grooves 120 correspond to the first bonding pads 110 by one-to-one. The grooves 120 expose the surface of the first bonding pads 110, and the first conductive adhesive 320 covers the grooves 120. In this embodiment, the first bonding pads 110 are disposed at a bottom of the grooves 120, the surface of the first bonding pads 110 do not protrude from an opening of the grooves 120, and the surface of the first conductive adhesive 320 away from the first bonding pads 110 is disposed beyond the opening of the grooves 120. By the above settings, the first conductive adhesive 320 can be adhered onto the surface of the first bonding pads 110 and can also adhered onto side walls of the grooves 120, which can increase a contact area between the first conductive adhesive 320 and the at least one daughter board 100, thereby greatly improving the first adhesive force between the first conductive adhesive 320 and the at least one daughter board 100.

Specifically, the thickness of the first conductive adhesive 320 is greater than the depth of the grooves 120, that is, the surface of the first conductive adhesive 320 away from the first bonding pads 110 also exceeds the plane where the opening of the grooves 120 is located. It should be understood that the depth of the grooves 120 refers to a distance from the exposed surface of the first bonding pads 110 to the opening of the grooves 120. The above settings can ensure that the grooves 120 are fully filled with the first conductive adhesive 320, and the cross-sectional area of the part of the first conductive adhesive 320 that exceeds the opening of the grooves 120 is also larger than that of the opening of the grooves 120. Therefore, the contact area between the first conductive adhesive 320 and the second conductive adhesive 420 can be increased, thereby greatly improving the second adhesive force between the first conductive adhesive 320 and the second conductive adhesive 420. In this embodiment, the width of the part of the first conductive adhesive 320 that exceeds the opening of the grooves 120 is also greater than the width of the grooves 120.

Specifically, the depth of the grooves 120 may range from 5 μm to 10 μm. For example, the depth of the grooves 120 may be 5 μm, 6 μm, 7 μm, 8 μm, 9 μm, or 10 μm. Of course, the depth of the grooves 120 may be adjusted according to actual situations and specific requirements, and is not specifically limited herein.

Specifically, the thickness of the first conductive adhesive 320 may range from 6 μm to 20 μm. For example, the thickness of the first conductive adhesive 320 may be 6 μm, 7 μm, 8 μm, 9 μm, 10 μm, 11 μm, 12 μm, 13 μm, 14 μm, 15 μm, 16 μm, 17 μm, 18 μm, 19 μm, or 20 μm. Of course, the thickness of the first conductive adhesive 320 may be adjusted according to actual situations and specific requirements, and is not specifically limited herein.

Specifically, the material of the first conductive adhesive 320 includes the first matrix resin, the first conductor, and the first additive, the material of the second conductive adhesive 420 includes the second matrix resin, the second conductor, and the second additive, and the content of the first matrix resin in the first conductive adhesive 320 is greater than the content of the second matrix resin in the second conductive adhesive 420. In the embodiments of the present disclosure, by allowing the content of the first matrix resin in the first conductive adhesive 320 to be greater than the content of the second matrix resin in the second conductive adhesive 420, the adhesion force between the first conductive adhesive 320 and the at least one daughter board 100 and the adhesion force between the first conductive adhesive 320 and the second conductive adhesive 420 are both greater than the adhesion between the second conductive adhesive 420 and the mother board 200, thereby allowing the first adhesive force and the second adhesive force are both greater than the third adhesive force.

Specifically, the thickness of the second conductive adhesive 420 may range from 20 μm to 200 μm. For example, the thickness of the second conductive adhesive 420 may be 20 μm, 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm, or 200 μm. Of course, the thickness of the second conductive adhesive 420 may be adjusted according to actual situations and specific requirements, and is not specifically limited herein.

Specifically, the first conductive adhesive 320 includes 8 wt % to 22 wt % of the first matrix resin, 48 wt % to 82 wt % of the first conductor, and 0.5 wt % to 5.5 wt % of the first additive, and the second conductive adhesive 420 includes 3 wt % to 17 wt % of the second matrix resin, 58 wt % to 87 wt % of the second conductor, and 0.01 wt % to 3.5 wt % of the second additive. It can be understood that the mass percentage of each component in the first conductive adhesive 320 and the second conductive adhesive 420 can be appropriately adjusted according to actual situations and specific requirements, and is not specifically limited herein.

Specifically, in the embodiments of the present disclosure, the first matrix resin and the second matrix resin may be photo-curable resins or thermosetting resins, which may be appropriately selected according to actual situations, and are not specifically limited herein.

Specifically, the first matrix resin may be selected from one or more of epoxy resins, phenolic resins, polyurethane resins, acrylic resins, and silicone resins. Similarly, the second matrix resin may be selected from one or more of epoxy resins, phenolic resins, polyurethane resins, acrylic resins, and silicone resins. Materials of the first matrix resin and the second matrix resin may be the same or different, and the materials of the first matrix resin and the second matrix resin may be appropriately adjusted according to actual situations and specific requirements, which are not specifically limited herein.

In the embodiments of the present disclosure, the first matrix resin and the second matrix resin are selected from epoxy resins, and the epoxy resins have high adhesion and wettability, and also have advantages of excellent mechanical and thermal properties, low shrinkage, and good bonding abilities, thereby allowing the first conductive adhesive 320 and the second conductive adhesive 420 manufactured subsequently to have good adhesion properties.

Specifically, the first matrix resin includes a polar group, and the second matrix resin includes another polar group. The interaction between the polar group of the first matrix resin and the polar group of the second matrix resin allows an extremely strong adhesion to form between the first conductive adhesive 320 and the second conductive adhesive 420, thereby greatly improving the second adhesive force. In this embodiment, the second adhesive force is much larger than the third adhesive force, so in the process of separating the at least one daughter board 100 from the mother board 200, the second conductive adhesive 420 will not remain on the mother board 200, which can reduce the difficulty of cleaning the mother board 200 in the rework process, thereby greatly reducing a risk of damaging film layers of the mother board 200 (such as the second bonding pads 210).

Specifically, the polar groups of the first matrix resin and the second matrix resin may be selected from a hydroxyl group, a carboxyl group, etc. The polar groups may be appropriately changed according to actual situations and specific requirements, and are not specifically limited herein.

Specifically, as shown in FIG. 9, a morphology of the first conductor is non-granular, and more specifically, the morphology of the first conductor is linear, branched, or scale-like. The fluidity of the first matrix resin in the molten state is better, and the first matrix resin and the first conductor can be fully in contact with each other, which is beneficial to improve a contact area between the first conductor and the first matrix resin, thereby improving the adhesion force of the first conductive adhesive 320, to obtain a dense film structure. This setting can enhance the second adhesive force. In this embodiment, the first conductor may be silver nanowires.

Specifically, as shown in FIG. 9, a morphology of the second conductor is granular. Compared to the first conductor, the morphology of the second conductor is granular, which is smoother. The second matrix resin are mainly on upper and lower sides of the second conductor, and the connectivity in the middle is weak, so the fluidity of the second matrix resin in the molten state is weak, thereby reducing the adhesion force of the second conductive adhesive 420. This setting can reduce the third adhesive force. In this embodiment, the second conductor may be silver nanoparticles.

Specifically, in the second conductive adhesive 420, if the particle size of the second conductor gets larger, the adhesion force of the second conductive adhesive 420 will be smaller. If the particle size of the second conductor is too large, the adhesion force of the second conductive adhesive 420 will be overly small, and in the manufactured display screen, the first bonding pads 110 and the second bonding pads 210 are prone to have poor contact. If the particle size of the second conductor is too small, the adhesion force of the second conductive adhesive 420 will be overly large, thereby causing the at least one daughter board 100 to be difficult to peel off from the mother board 200 in the rework process.

In order to prevent the above problems, the particle size of the second conductor should be controlled to range from 10 nm to 200 nm. Therefore, the second conductive adhesive 420 can be ensured to have enough adhesion force to adhere onto the second bonding pads 210, and it can also ensure that the second conductive adhesive 420 can be peeled off from the mother board 200 in the rework process to reduce the residue.

The display screen and the manufacturing method thereof provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display screen, comprising:
a mother board;
at least one daughter board disposed opposite to the mother board;
a first conductive adhesive disposed between the mother board and the at least one daughter board, wherein a first adhesive force is formed between the first conductive adhesive and the at least one daughter board, wherein a material of the first conductive adhesive comprises a first matrix resin and a first conductor, and the first matrix resin comprises a polar group; and
a second conductive adhesive disposed between the first conductive adhesive and the mother board, wherein the second conductive adhesive is in direct contact with the first conductive adhesive, a second adhesive force is formed between the first conductive adhesive and the second conductive adhesive, and a third adhesive force is formed between the second conductive adhesive and the mother board, a material of the second conductive adhesive comprises a second matrix resin and a second conductor, and the second matrix resin comprises another polar group;
wherein both the first adhesive force and the second adhesive force are greater than the third adhesive force.

2. The display screen according to claim 1, wherein a content of the first matrix resin in the first conductive adhesive is greater than a content of the second matrix resin in the second conductive adhesive.

3. The display screen according to claim 2, wherein the material of the first conductive adhesive comprises 8 wt % to 22 wt % of the first matrix resin, and the material of the second conductive adhesive comprises 3 wt % to 17 wt % of the second matrix resin.

4. The display screen according to claim 1, wherein a morphology of the first conductor is non-granular.

5. The display screen according to claim 4, wherein the morphology of the first conductor is linear, branched, or scale-like.

6. The display screen according to claim 1, wherein a morphology of the second conductor is granular.

7. The display screen according to claim 1, wherein the at least one daughter board is provided with a first bonding pad, and the first conductive adhesive is connected to the first bonding pad;
the mother board is provided with a second bonding pad, and the second conductive adhesive is connected to the second bonding pad; and
the first bonding pad is electrically connected to the second bonding pad by the first conductive adhesive and the second conductive adhesive.

8. The display screen according to claim 7, wherein the at least one daughter board is defined with a groove corresponding to the first bonding pad, the first bonding pad is disposed at a bottom of the groove, the first conductive adhesive covers the groove, and a surface of the first conductive adhesive away from the first bonding pad is beyond an opening of the groove.

9. The display screen according to claim 8, wherein a part of the first conductive adhesive beyond the opening of the groove has a width greater than a width of the groove.

10. A manufacturing method of a display screen, comprising following steps:
a step B1: providing a mother board and at least one daughter board;
a step B2: disposing a first conductive adhesive on the at least one daughter board, wherein a first adhesive force is formed between the first conductive adhesive and the at least one daughter board, wherein a material of the first conductive adhesive comprises a first matrix resin and a first conductor, and the first matrix resin comprises a polar group;
a step B3: disposing a second conductive adhesive on the first conductive adhesive, wherein the second conductive adhesive is in direct contact with the first conductive adhesive, a second adhesive force is formed between the first conductive adhesive and the second conductive adhesive, a material of the second conductive adhesive comprises a second matrix resin and a second conductor, and the second matrix resin comprises another polar group; and
a step B4: assembling the mother board and the at least one daughter board, wherein the first conductive adhesive and the second conductive adhesive are disposed between the mother board and the at least one daughter board, a third adhesive force is formed between the second conductive adhesive and the mother board, and both the first adhesive force and the second adhesive force are greater than the third adhesive force.

11. The manufacturing method of the display screen according to claim 10, wherein the step B2 comprises:
a step B21: disposing a first conductive paste on the at least one daughter board; and
a step B22: curing the first conductive paste to obtain the first conductive adhesive.

12. The manufacturing method of the display screen according to claim 11, wherein the step B3 comprises a step of disposing a second conductive paste on the first conductive adhesive to form the second conductive adhesive; and
a content of the first matrix resin in the first conductive paste is greater than a content of the second matrix resin in the second conductive paste.

13. The manufacturing method of the display screen according to claim 12, wherein the first conductive paste comprises 10 wt % to 20 wt % of the first matrix resin, and the second conductive paste comprises 5 wt % to 15 wt % of the second matrix resin.

14. The manufacturing method of the display screen according to claim 10, wherein a morphology of the first conductor is non-granular.

15. The manufacturing method of the display screen according to claim 14, wherein the morphology of the first conductor is linear, branched, or scale-like.

16. The manufacturing method of the display screen according to claim 10, wherein a morphology of the second conductor is granular.

17. The manufacturing method of the display screen according to claim 12, wherein in the step B4, after assembling the mother board and the at least one daughter board, the second conductive adhesive is pre-cured.

18. The manufacturing method of the display screen according to claim 17, further comprising following steps:
a step B5: conducting an electrical test on the first conductive adhesive and the second conductive adhesive, proceeding to a step B6 if conductive properties of the first conductive adhesive and the second conductive adhesive are qualified, and proceeding to a step B7 if the conductive properties of the first conductive adhesive and the second conductive adhesive are abnormal;

the step B6: post-curing the second conductive adhesive; and the step B7: separating the mother board from the at least one daughter board, cleaning the mother board and the at least one daughter board, and repeating the steps B3 to B5.

* * * * *